(12) United States Patent
Massie et al.

(10) Patent No.: US 7,852,148 B2
(45) Date of Patent: Dec. 14, 2010

(54) METHOD OF FORMING A SENSING CIRCUIT AND STRUCTURE THEREFOR

(75) Inventors: Harold L. Massie, Medical Lake, WA (US); Jarvis Leroy Carter, Sr., Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 145 days.

(21) Appl. No.: 12/413,271

(22) Filed: Mar. 27, 2009

(65) Prior Publication Data

US 2010/0244947 A1 Sep. 30, 2010

(51) Int. Cl.
*H01L 25/00* (2006.01)

(52) U.S. Cl. ...................... 327/566; 327/427

(58) Field of Classification Search ............. 327/427, 327/564–566
See application file for complete search history.

(56) References Cited

U.S. PATENT DOCUMENTS

| | | | |
|---|---|---|---|
| 5,272,392 A * | 12/1993 | Wong et al. | 327/109 |
| 5,374,857 A | 12/1994 | Carobolante | |
| 5,422,593 A * | 6/1995 | Fujihira | 327/561 |
| 5,801,573 A * | 9/1998 | Kelly et al. | 327/434 |
| 5,852,359 A * | 12/1998 | Callahan et al. | 323/274 |
| 5,874,830 A * | 2/1999 | Baker | 323/316 |
| 5,877,617 A * | 3/1999 | Ueda | 323/316 |
| 5,903,422 A * | 5/1999 | Hosokawa | 361/93.1 |
| 6,304,108 B1* | 10/2001 | Inn | 327/72 |
| 7,102,337 B2* | 9/2006 | Wheeler et al. | 323/282 |
| 2006/0226820 A1 | 10/2006 | Farkas | |
| 2008/0191779 A1* | 8/2008 | Heppenstall | 327/427 |

OTHER PUBLICATIONS

Phillips Electronics Application Note; AN10322_1 Current Sensing Power MOSFETs; Rev.0100—Sep. 9, 2004; Netherlands.
ON Semiconductor Application Note: AND8210/D; Current Sensing Power MOSFET Use in DC-DC Converters; Hal Massie; May 2005—Rev. 0; http://onsemi.com.

* cited by examiner

*Primary Examiner*—Lincoln Donovan
*Assistant Examiner*—William Hernandez
(74) *Attorney, Agent, or Firm*—Robert F. Hightower

(57) ABSTRACT

In one embodiment, a sensing circuit includes a sense transistor and a compensation circuit to improve the accuracy of a sensing signal formed by the sensing circuit.

20 Claims, 7 Drawing Sheets

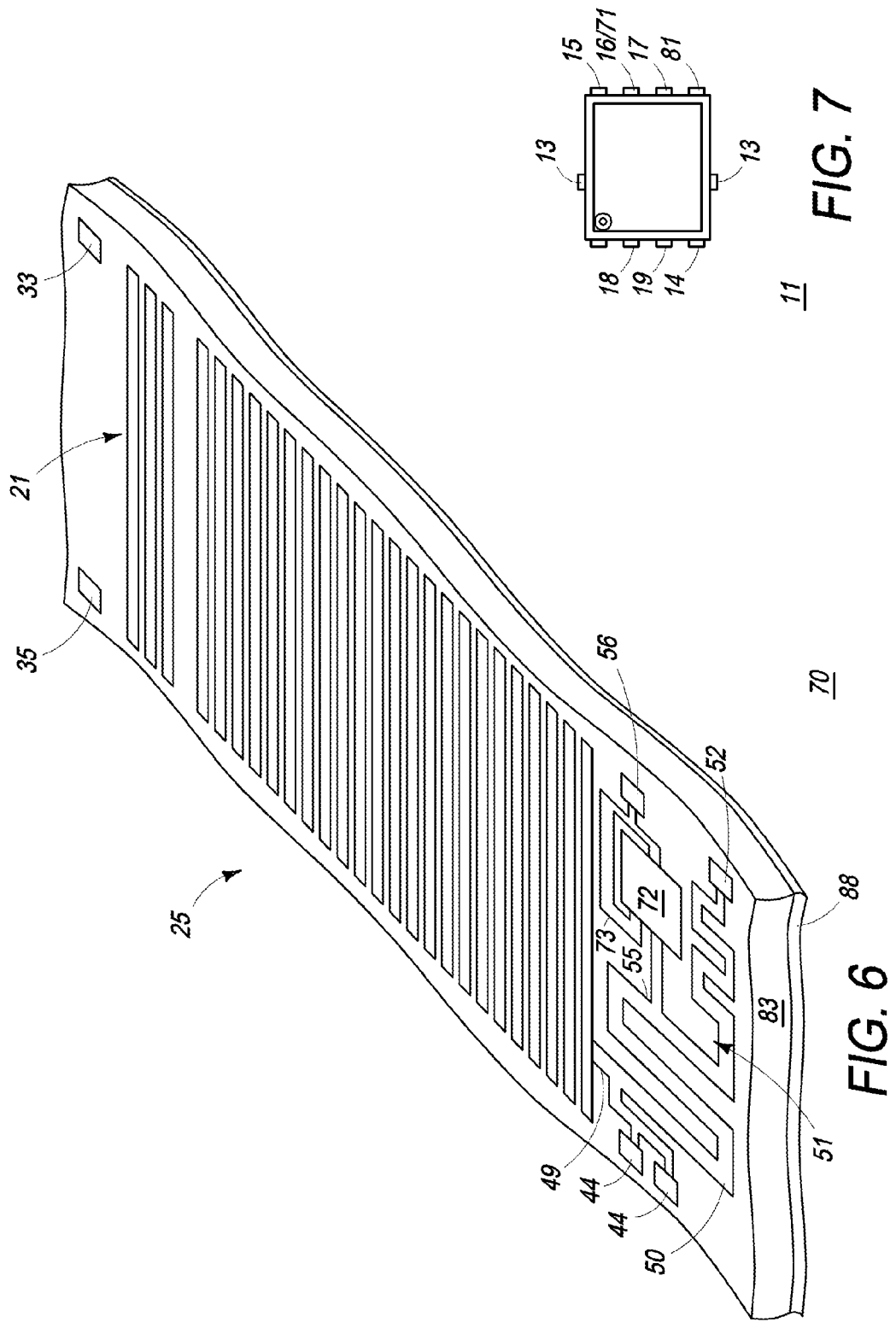

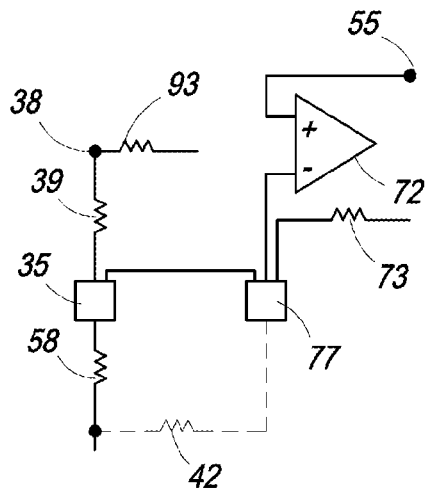 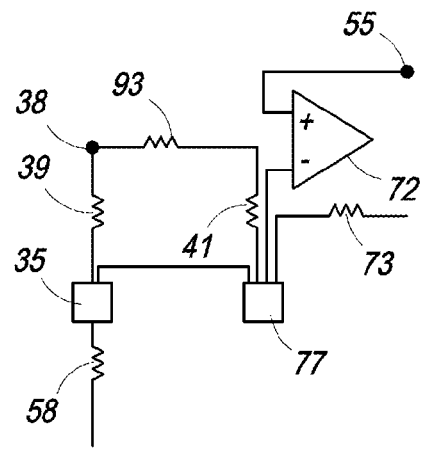
FIG. 8  FIG. 9
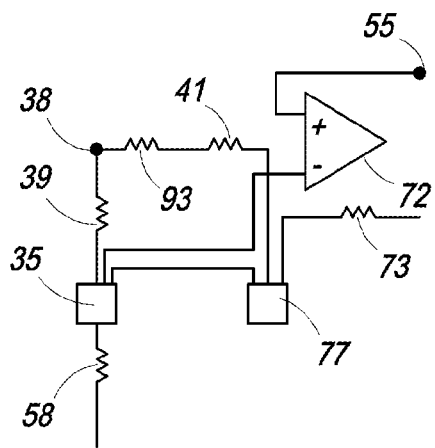 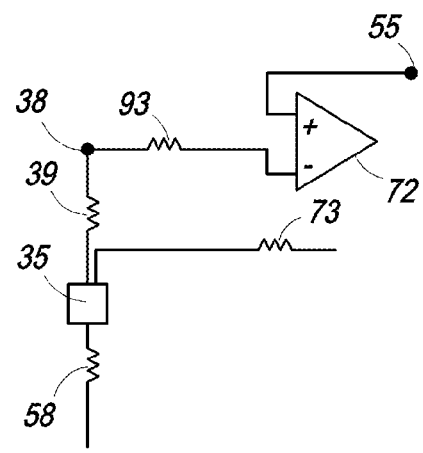
FIG. 10  FIG. 11

METHOD OF FORMING A SENSING CIRCUIT AND STRUCTURE THEREFOR

BACKGROUND OF THE INVENTION

The present invention relates, in general, to electronics, and more particularly, to semiconductors, structures thereof, and methods of forming semiconductor devices.

In the past, the semiconductor industry utilized various methods and circuits to form current sense signals that were representative of a current through a transistor such as a power metal oxide semiconductor (MOS) field effect transistor (FET). One particular circuit configuration utilized two transistors with commonly connected drains and gates and separate sources. The active area of the sources was ratioed to each other so that the current flowing through one transistor was a small percentage of the current flowing through the other transistor. This was often called a mirror transistor configuration or a SenseFET. It was found that the value of the current through the small transistor was not always a constant ratio to the value of the current through the larger transistor. Therefore, some configurations included a separate Kelvin connection that facilitated connecting a Kelvin sense terminal directly to the source of the large transistor.

FIG. 1 illustrates a prior art example of a SenseFET 215 that had a main transistor (MT) and a sense transistor (S). The source(SS) of the sense transistor (ST) was brought to a connection external to the package of SenseFET 215. The source (MS) of the main transistor (MT) was brought to a connection external to the package of SenseFET 215 and the Kelvin sense (KS) was brought to another external terminal of the package. In some configurations, an amplifier 220 was connected in a virtual ground or virtual earth connection. It was believed that such a configuration provided a signal at the sense source (SS) that was a more accurate representation of the current through the main transistor by maintaining the sense source (SS) and the main source (MS) at the same potential. However, it has been found that even this configuration resulted in inaccuracies between the value of the current through the main and sense transistors.

Accordingly, it is desirable to have a current sense circuit and method that provides a signal that more accurately represent the value of the current through the main transistor and the current through the drain of the combined main and sense transistor.

BRIEF DESCRIPTION OF THE DRAWINGS

FIG. 6 illustrates an enlarged isometric view of an embodiment of a portion of a semiconductor substrate on which the current sense circuit of FIG. 4 is formed in accordance with the present invention;

FIG. 7 illustrates a plan view of semiconductor package that houses the semiconductor substrate of FIG. 6 in accordance with the present invention; and FIG. 8-FIG. 11 schematically illustrate alternate embodiments of some of the connections for the embodiment of the improved current sense circuit of FIG. 5 in accordance with the present invention.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, or certain N-type or P-type doped regions, a person of ordinary skill in the art will appreciate that complementary devices are also possible in accordance with the present invention. It will be appreciated by those skilled in the art that the words during, while, and when as used herein relating to circuit operation are not exact terms that mean an action takes place instantly upon an initiating action but that there may be some small but reasonable delay, such as a propagation delay, between the reaction that is initiated by the initial action. The use of the word approximately or substantially means that a value of an element has a parameter that is expected to be very close to a stated value or position. However, as is well known in the art there are always minor variances that prevent the values or positions from being exactly as stated. It is well established in the art that variances of up to at least ten per cent (10%) (and up to twenty per cent (20%) for semiconductor doping concentrations) are reasonable variances from the ideal goal of exactly as described. For clarity of the drawings, doped regions of device structures are illustrated as having generally straight line edges and precise angular corners. However, those skilled in the art understand that due to the diffusion and activation of dopants the edges of doped regions generally may not be straight lines and the corners may not be precise angles.

In addition, the description illustrates a cellular design (where the body regions are a plurality of cellular regions) instead of a single body design (where the body region is comprised of a single region formed in an elongated pattern, typically in a serpentine pattern). However, it is intended that the description is applicable to both a cellular implementation and a single base implementation.

DETAILED DESCRIPTION OF THE DRAWINGS

Figure 2:
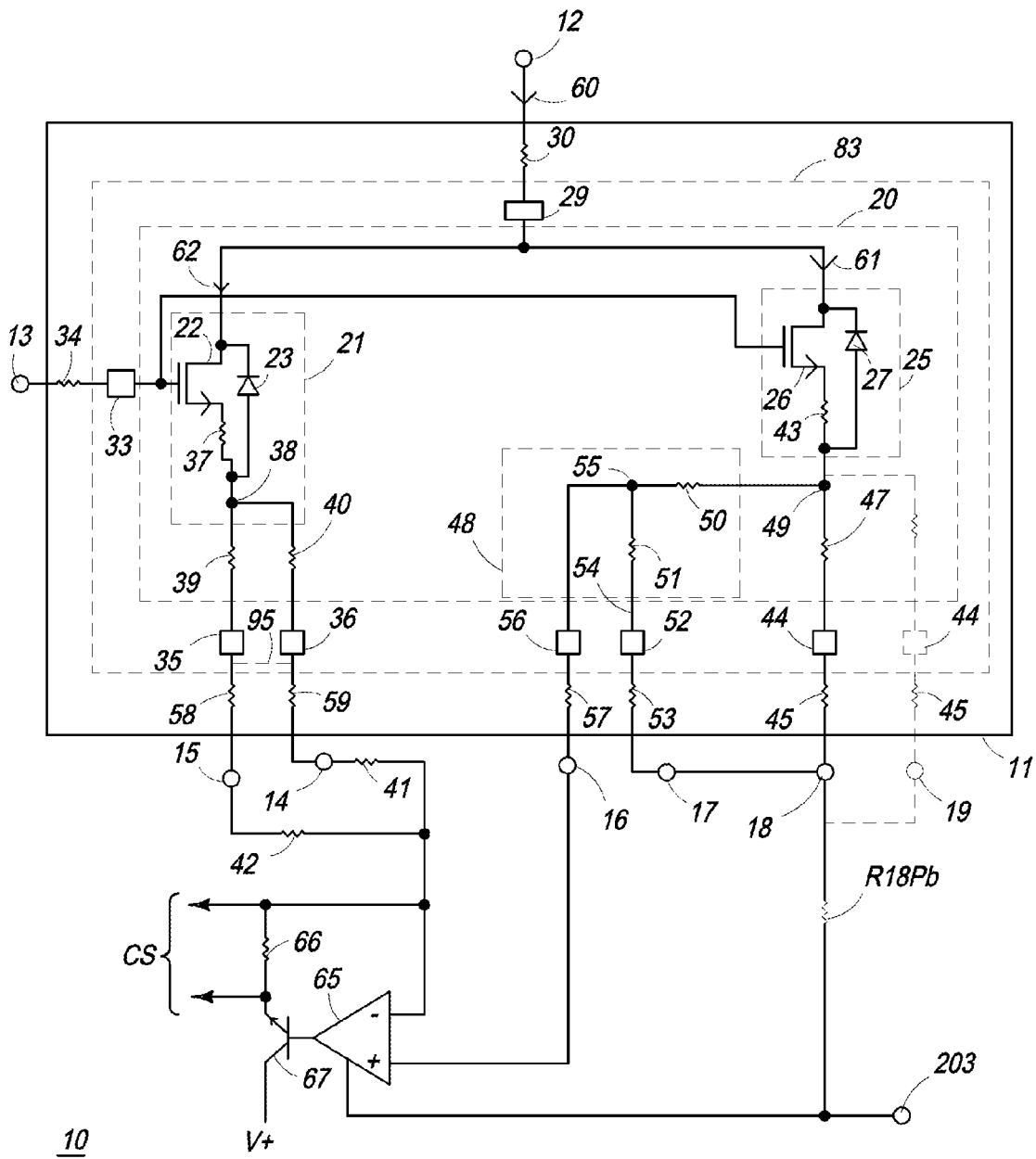
FIG. 2 schematically illustrates an embodiment of a portion of an improved current sense circuit in accordance with the present invention.

FIG. 2 schematically illustrates a portion of an exemplary embodiment of a current sense circuit 10 that includes a sensing type of transistor or transistor 20. In the preferred embodiment, transistor 20 is a SenseFET type of transistor but may also be other types of a two transistor pair where one transistor is a main transistor that conducts a large current and the other transistor is mirror transistor that conducts a current that is a percent of the large current of the main transistor. Those skilled in the art will appreciate that a SenseFET type of transistor generally is formed of many transistor cells that are interconnected to form a larger transistor or main transistor that can conduct a large current with a low on-resistance. A few of the cells have their sources separated from the sources of the remaining cells to form a smaller transistor or sense transistor, the sources of the sense cells are brought to a separate external terminal or sense terminal. The respective drains of all the cells and the gates of all the cells generally are common connected to form the respective drain and gate of the SenseFET. SENSEFET is a trademark of Semiconductor Components Industries, LLC (SCILLC) of Phoenix, Ariz. One example of a SENSEFET type of transistor is disclosed in U.S. Pat. No. 4,553,084 issued to Robert Wrathall on Nov. 12, 1985, which is hereby incorporated herein by reference.

Transistor 20 includes a main transistor 25 and a sense transistor 21 that are identified in general by dashed boxes. Elements within the dashed box illustrate various transistor elements that are inherent in sense transistor 21 and main transistor 25 including respective body diodes 23 and 27, and respective transistor portions 22 and 26. Transistors 21 and 25 typically include an on-resistance that is illustrated by respective resistors 37 and 43. The on-resistance often is referred to as the resistance between the drain and source when the transistor is on and may be abbreviated as Rdson. Transistor 20 also usually includes a compensation circuit 48. In the preferred embodiment, compensation circuit 48 includes a resistor divider that has a resistor 50 and a resistor 51 connected in series to form a sense node 55 at a common connection between resistors 50 and 51. Compensation circuit 48 also includes an input 49 that is connected to the source of main transistor 25 and an output 54.

As will be seen further hereinafter, such as in FIG. 6, transistors 21 and 25 are formed on a semiconductor substrate, such as a semiconductor substrate 83, and are formed with commonly connected gates and commonly connected drains. In order to facilitate forming external connections to transistor 20, a plurality of connection pads are formed on substrate 83. A connection pad 44 is electrically connected to the input of circuit 48 and to the source of transistor 25. A connection pad 52 is connected to output 54 of circuit 48. In the preferred embodiment, connection pad 52 is connected to one terminal of resistor 51 via output 54. A connection pad 56 is connected to sense node 55, and a connection pad 35 is connected to the source of transistor 21. An optional connection pad 36 is also connected to the source of transistor 21 and facilities an optional circuit embodiment as will be seen further hereinafter. The gates of transistors 21 and 25 are commonly connected to a connection pad 33 and the drains of transistors 21 and 25 are commonly connected to a connection pad 29. As will be appreciated by those skilled in the art, the electrical connections from circuit 48 and the elements of transistors 21 and 25 to connection pads 29, 33, 35, 36, 44, 52, and 56 typically are formed as conductor routings, and generally metal routings, on substrate 83. The conductor routing on substrate 83 for the sources of transistors 21 and 25 have some resistance that is illustrated by resistors 39, 40, and 47.

Substrate 83 and transistor 20 usually are encapsulated within a semiconductor package 11 that has a plurality of external terminals. Substrate 83 may be attached to package 11, such as attached to a leadframe of package 11. Various well-known techniques maybe utilized to provide electrical connection between the external terminals of package 11 and the connection pads on substrate 83. For example, substrate 83 may be attached to a leadframe and wire bonds may be formed between the connection pads of substrate 83 and the terminals of package 11. Various other well-known techniques also may be utilized to provide electrical connection between the connection pads and the external terminals of package 11 including solder bumps, TAB leads, or a clip lead. One example of a clip lead is explained in U.S. Pat. No. 7,202,106 that issued to Carney et al. on Apr. 10, 2007).

Whatever techniques are utilized, the electrical path from the connection pad to the external terminal of package 11 has an associated wiring resistance. A resistor 30 illustrates the package wiring resistance between connection pad 29 and terminal 12. Similarly, resistors 34, 58, 59, 57, 53, and 45 illustrates the package wiring resistance between connection pads 33, 35, 36, 56, 52, and 44 and terminals 13, 15, 14, 16, 17, and 18, respectively. As will be appreciated by those skilled in the art, transistor 20 may have a plurality of connections to the source of transistor 25. One such optional additional connection to the source of transistor 25 is illustrated in dashed lines by an optional extra connection to an optional terminal 19 and an additional pad 44.

During the operation of transistor 20, a current 60 may flow into terminal 12 and through transistor 20. For the application illustrated in FIG. 2, transistor 20 is configured to conduct current 60 into terminal 12. However, those skilled in the art will appreciate that currents 61 and 62 may flow from terminals 18 and 15 to terminal 12. For the application illustrated in FIG. 2, a portion of current 60 flows through main transistor 25 as a current 61 and a smaller portion of current 60 flows through sense transistor 21 as a current 62. The connections to the drain and source of transistor 25 form a current flow path for current 61 and resistors 45 and 47 represent the resistance of the conductors in that current flow path. The current from transistor 21 usually is used to form a current sense signal that is representative of the value of current 60. The ratio between the value of current 62 to the value of current 60 is referred to as the current ratio (Iratio) of transistor 20. Iratio is usually expressed as:

$$Iratio = \frac{I62 + I61}{I62} \qquad (E1)$$

Where:
I61—the value of current I61, and
I62—the value of current I62.

Transistor 25 is formed with a source area that is larger than the source area of transistor 21 so that there is a source area ratio between the source areas of transistors 21 and 25. For example, the source area of transistor 25 may be three hundred fifty (350) times the source area of transistor 21 so that transistors 21 and 25 have a source area ratio of 350:1. Under ideal circumstances, the value of Iratio is approximately equal to the source area ratio, thus, the value of current 62 ideally would be the value of current 60 multiplied by the inverse of the area ratio. For example, if the source area ratio were three hundred fifty (350), then the value of current 62 ideally should be the value of current 60 divided by three hundred fifty (350).

In the past, various factors caused the value of Iratio to vary which caused current 62 to not accurately represent the value of current 60. Because the value of current 61 usually is much larger than the value current 62, the voltage drop across the wiring resistance illustrated by resistor 45 is much greater the voltage drop across the wiring resistance illustrated by resistor 58 or resistors 58 and 59. Technology advances have led to consistently lower Rdson values thereby lowering the value of resistor 43 and also have led to lower values of resistor 45 making resistor 43 close to the value of resistor 45 and generally also closer to resistor 47. Consequently, the value of the voltage drop across resistor 45 and/or resistor 47 becomes more important. Also, the value of resistors 39 and 58 and resistors 45 and 47 generally do not have the same resistance ratio as the Iratio value. Therefore, the difference between the resistance value of resistors 39 and 58 and resistors 45 and 47 causes the value of Iratio to not be ideal which causes current 62 to not accurately represent the value of current 60.

Consequently, it has been found that it is important to compensate for the voltage drop across resistors 45 and 47 as compared to the voltage drop across resistors 39 and 58. Other factors also could affect the accuracy of Iratio and current 62. For example, the value of any of resistors 39, 40, 45, 47, 58, and 59 can vary as the temperature varies. Also, the portion of the substrate near transistor 25 can be hotter than the portion of the substrate near transistor 21 thereby causing resistor 43 to vary while resistor 37 may not vary or resistor 43 may have a larger percentage variation than resistor 37 due to non-uniform heating effects. Additionally, manufacturing tolerances can result in the resistance of resistors 37 and 43 to vary, from one manufactured part to a subsequent manufactured part, more or less than the value of resistors 45 and 58/59. This part-to-part variation of Rdson relative to the value of resistors 47 and 58/59 can cause Iratio to vary and not remain constant which could also result in the value of current 62 not accurately representing the value of current 60.

Compensation circuit 48 is also formed on semiconductor substrate 83 with transistors 21 and 25 in order to assist in keeping the value of Iratio substantially constant due to such changes. Additional connection pads 36, 52, and 56 can also assist in maintaining Iratio more constant. It has been found that compensation circuit 48 compensates for such variations and maintains Iratio to a more constant value in view of the voltage drop across resistor 45 and/or resistor 47 in view of temperature variations thereof, and variations of the Rdson relative to resistors 45, 47, and 58/59 due to part-to-part variations and temperature variations. The more constant value of Iratio facilitates the value of current 62 more accurately representing the value of current 60. Therefore, current 62 can be used to form a sense signal that more accurately represents the value of current 60. As will be seen further hereinafter, optional resistors 41 and 42 can also be used to assist in minimizing changes in Iratio.

In some applications, an operational amplifier, such as amplifier 65, may be connected in a virtual ground configuration with a feedback network to receive the current from transistor 21 and form a current sense signal on the output of amplifier 65. Amplifier 65 usually has an inverting input connected to a feedback configuration and is also connected to receive the sense current from transistor 21. A non-inverting input of amplifier 65 is connected to receive the sense signal from sense node 55 of compensation circuit 48. A feedback resistor 66 usually is connected to the inverting input of amplifier 65 to provide a feedback path from the output. In some embodiments, a transistor 67 may be in the feedback path between the output of amplifier 65 and resistor 66 to provide a current buffer and possibly lower power consumption. A voltage usually is connected to the collector of transistor 67. Although transistor 67 is illustrated an NPN transistor it may be other types including a PNP or an MOS transistor (along with appropriate voltage sources). In other embodiments, transistor 67 is omitted and resistor 66 is connected between the output and the inverting input of amplifier 65. The feedback provided from the output of amplifier 65 back to the inverting input causes amplifier 65 to force the voltages at the inverting and non-inverting inputs of amplifier 65 to be substantially equal. In the preferred embodiment, compensation circuit 48 is coupled in parallel with the wiring resistance of the current flow path of transistor 25. It is believed that this configuration assists compensation circuit 48 in distributing the voltage drops associated with the resistance of the current flow path, such as the parasitic elements of package 11 that are connected to transistor 25, across circuit 48, such as resistors 50 and 51. Consequently, it usually is preferable for input 49 to be connected as close as possible to the source of transistor 25 and closer to the source than pad 44 and resistor 45 are connected. This allows circuit 48 to form a voltage at node 55 that is a portion of the parasitic voltage drops. Therefore, the voltage at node 55 preferably can be kept substantially equal to the voltage on the source of transistor 21 minus the voltage drops in the current flow path from the source to terminals 14 and 15. This allows the value of resistors 50 and 51 to be chosen to force the source of transistor 25 to a value that compensates for the parasitic elements in the current flow path of currents 61 and 62 and to also compensate for temperature variations thereof. It is believed that terminal 17 should be connected to terminal 18 to assist in the operation of circuit 48. The connection between terminals 17 and 18 may also be made inside package 11 as long as the connection is made close to the terminals of resistors 53 and 45 that has the lowest voltage relative to the common reference voltage on terminal 203 so that circuit 48 compensates for resistors 45 and 47 in addition to any variations thereof.

As can be seen from the above explanation, it is desirable to minimize the variation of Iratio. Thus, the value of resistors 50, 51 and optional resistors 41 and 42 are chosen to provide such a relationship. As shown by equation E1 above (and repeated again here), $$Iratio = \frac{I62 + I61}{I62} \qquad (E1)$$

The current through resistors 53 and 57 is extremely small compared to the current through resistors 45 and 47, thus, the value of resistors 53 and 57 and the associated current can be ignored. Using these preferred embodiment assumptions, the value of current 61 can be expressed by:

$$I61 = \frac{Vd20}{R43 + R18Pb + \frac{S4547*(R50+R51)}{S4547+R50+R51}} \qquad (E2)$$

Where:
Vd20—the voltage on the drain of transistor 20 relative to the common reference voltage such as the voltage on terminal 203,
R43—value of resistor 43,
R18Pb—resistance value of the printed circuit board connections between terminals 18 and 203,
S4547—resistance of the series combination of resistors 45 and 47,
R50—value of resistor 50, and
R51—value of resistor 51.

If the sum of resistors 50 and 51 is much larger than the sum of resistors 45 and 47, then the combination of resistors 45 and 47 in parallel with resistors 50 and 51 can be approximated by resistors 45 and 47. Thus, equation E2 becomes:

$$I61 = \frac{Vd20}{R43 + R18Pb + S4547} \qquad (E3)$$

The equation for current 62 is:

$$I62 = \frac{Vd20 - (I61*R18Pb) - \left(I61*S4547*\frac{R51}{R50+R51}\right)}{R37 + \left((R41+S4059+R40)*\frac{S3958+R42}{S4059+S3958+R42}\right)} \quad (E4)$$

Where:
- S3958—resistance of the series combination of resistors 39 and 58,
- S4059—resistance of the series combination of resistors 40 and 59,
- R41—value of resistor 41,
- R42—value of resistor 42.

Substituting equations E3 and E4 back into E1 yields:

$$Iratio = \frac{I62 + I61}{I62} \quad (E5)$$

$$= \frac{R37 + \frac{R41*(S3958+R42)}{R41+S3958+R42}}{R43 + \left(S4547*\left(1 - \frac{R51}{R50+R51}\right)\right)}$$

If optional resistors 41 and 42 are not used, equation E5 becomes:

$$Iratio = \frac{I62 + I61}{I62} \quad (E6)$$

$$= \frac{R37 + S3958}{R43 + \left(S4547*\left(1 - \frac{R51}{R50+R51}\right)\right)}$$

For the embodiment where resistors 41 and 42 are not used, resistor 41 and the connections thereto are omitted, and resistor 42 is replaced by a wire or short. Thus, in this embodiment, the voltage at terminal 14 of package 11 is kept substantially to the value of terminal 16.

Since the value of resistors 39, 45, 47, and 58 are parasitic elements of transistor 20, the values of resistors 50 and 51 can be chosen to minimize variations in the value of Iratio for the conditions of interest. For example, to minimize Iratio variations as temperature changes, the value of resistors 37, 39, 43, 45, 47, and 58 can be measured or calculated at one temperature (room temperature for example). Then the values for resistors 37, 39, 43, 45, 47, and 58 can be measured or calculated at a second temperature (seventy or one hundred degrees Celsius [70° C. or 100° C.]) for example. Then, a successive iteration procedure can be used to find the values of resistors 50 and 51 that result in the smallest variation of Iratio. In one example, the value of resistor 58 in series with 39, resistor 37, resistor 43, and resistor 45 in series with resistor 47 at 25° C. were respectively 20, 1085, 3.1, and 0.35 milli-ohms, and at 100° C. were, respectively, 24.8, 1492, 4.26, and 0.44 milli-ohms. The value found for resistors 50 and 51 were three hundred fifty (350) and three hundred (300) ohms, respectively. These values for resistors 50 and 51 resulted in an Iratio variation of about 0.05% over the temperature range from twenty five to one hundred degrees Celsius (25° C.-100° C.). Without resistors 50 and 51, the variation of Iratio was approximately 0.5% over that temperature range.

Optional resistors 41 and 42 can be added along with resistors 50 and 51 or used without resistors 50 and 51 to further improve the Iratio variation. It usually is preferable for pad 36 to be connected as close as possible to the source of transistor 21. It is believed that resistors 41 and 42 are beneficial in reducing Iratio variations due to resistor 43 changing more than resistor 37, such as transistor 25 being hotter than transistor 21 or such as having a greater percentage variation than resistor 37. It is believed that since resistors 41 and 42 usually assist in reducing temperature variations, it is preferable for resistors 41 and 42 to have a low temperature coefficient. In some semiconductor processes it may be difficult to form such low temperature coefficient resistors on a semiconductor substrate, thus, resistors 41 and 42 are illustrated as external to substrate 83 and typically are external to package 11. In some embodiments, resistors 41 and 42 can be assembled within package 11 and electrically connected to substrate 83. In other embodiments where it is possible to form low temperature coefficient resistors on a semiconductor substrate, resistors 41 and 42 may be formed thereon. It is also believed that values for resistors 41 and 42 can be determined that include temperature coefficients, as long as the temperature coefficients are included in the Iratio equations such as equations E1-E6.

Those skilled in the art will appreciate that transistor 67 may be omitted and resistor 66 may be connected directly to the output of amplifier 65. The current sense signal (CS) usually is taken as a differential signal across resistor 66. Additionally other circuits may be used instead of amplifier 65. Those skilled in the art will appreciate that any circuit that can maintain two voltages at substantially equal values, such as the voltages illustrated as applied to the inverting and non-inverting inputs of amplifier 65, could be used instead of amplifier 65.

In an optional embodiment, pad 36 may be omitted and resistor 59 may be connected directly to pad 35 as illustrated by a dashed line 95. This configuration is effective if the value of resistor 39 is small enough to be ignored. In another optional embodiment, terminal 14 and resistor 59 may also be omitted.

Figure 1:
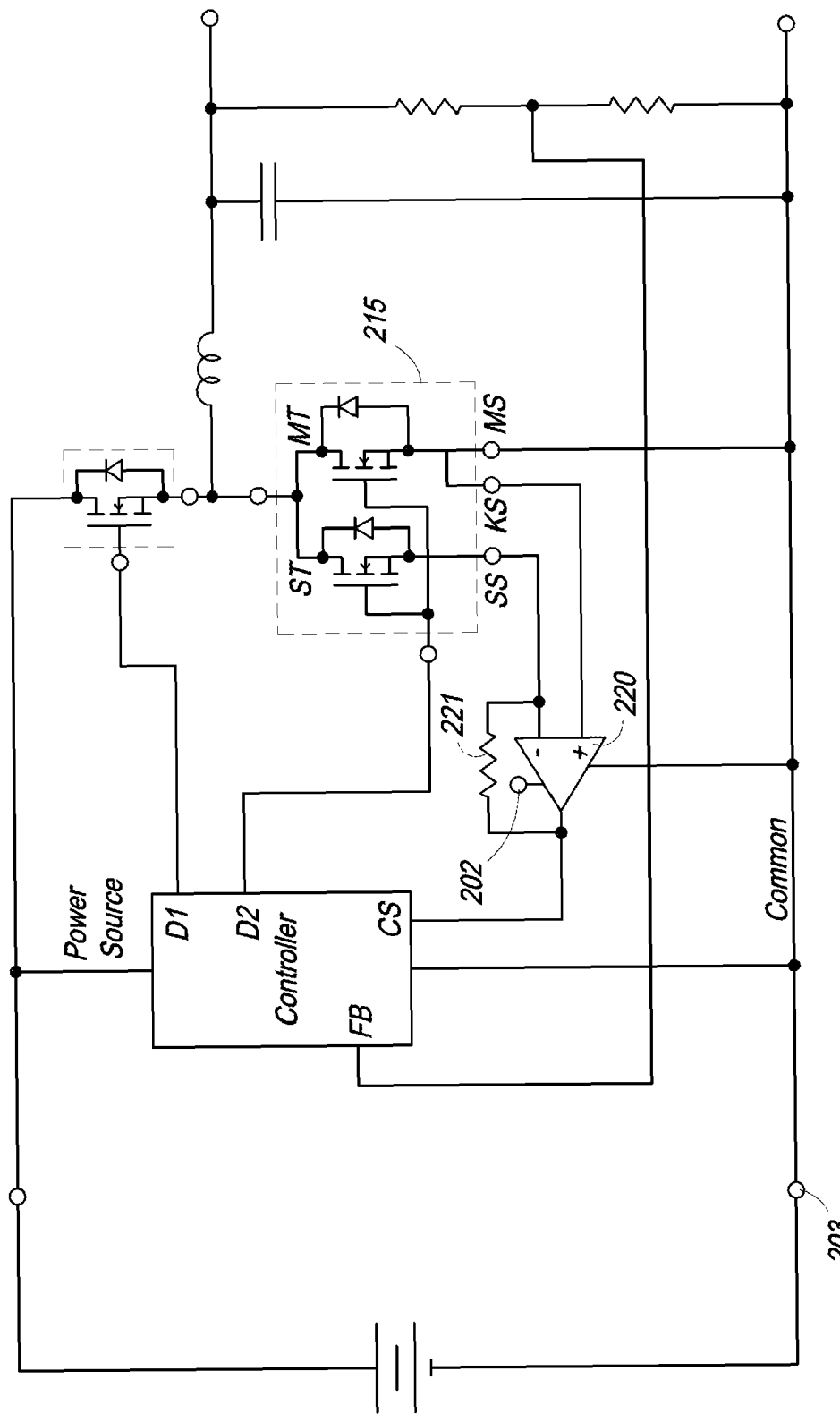
FIG. 1 schematically illustrates a prior art sense circuit.
Figure 3:
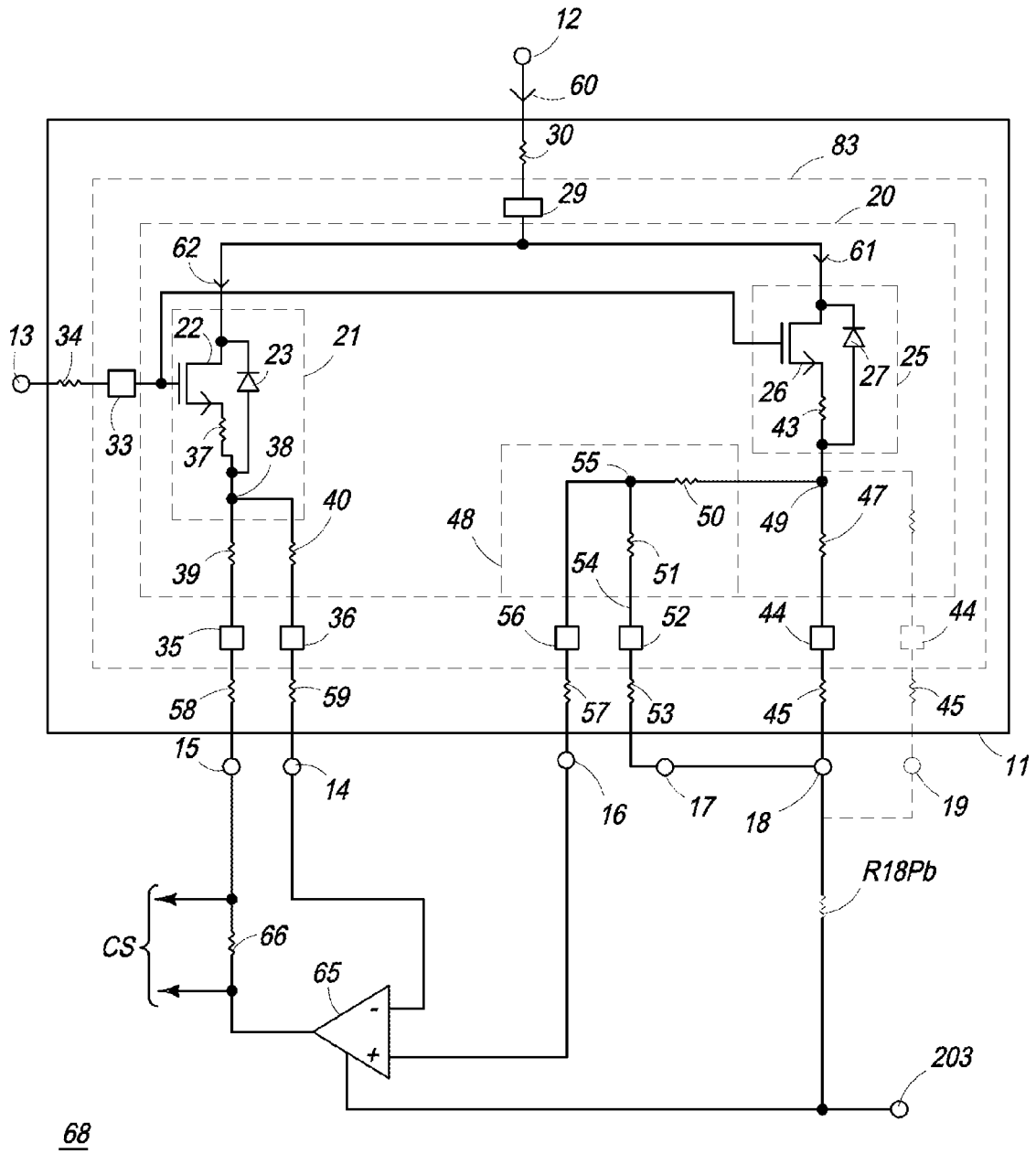
FIG. 3 schematically illustrates an embodiment of a portion of another improved current sense circuit in accordance with the present invention.

FIG. 3 schematically illustrates a portion of an exemplary embodiment of a current sense circuit 68 that includes transistor 20 that was described in the description of FIG. 1. Circuit 68 is similar to circuit 10 of FIG. 1 except that the inverting input of amplifier 65 is connected directly to terminal 14 and is not connected to resistor 66. The feedback for amplifier 65 is from the output of amplifier 65 through the connection chain to node 38 and back to the inverting input of amplifier 65. Resistor 66 is in the current flow path from the source of transistor 21 and forms the sense signal, the path through resistor 66 usually has a higher current than the current flow path through pad 36 and resistors 40 and 59. Therefore, this configuration more accurately compensates Iratio if the majority of the variation results from variations of any of resistors 45, 47, 39, and 58. Those skilled in the art will appreciate that transistor 67 may also be used with amplifier 65 and resistor 66.

Figure 4:
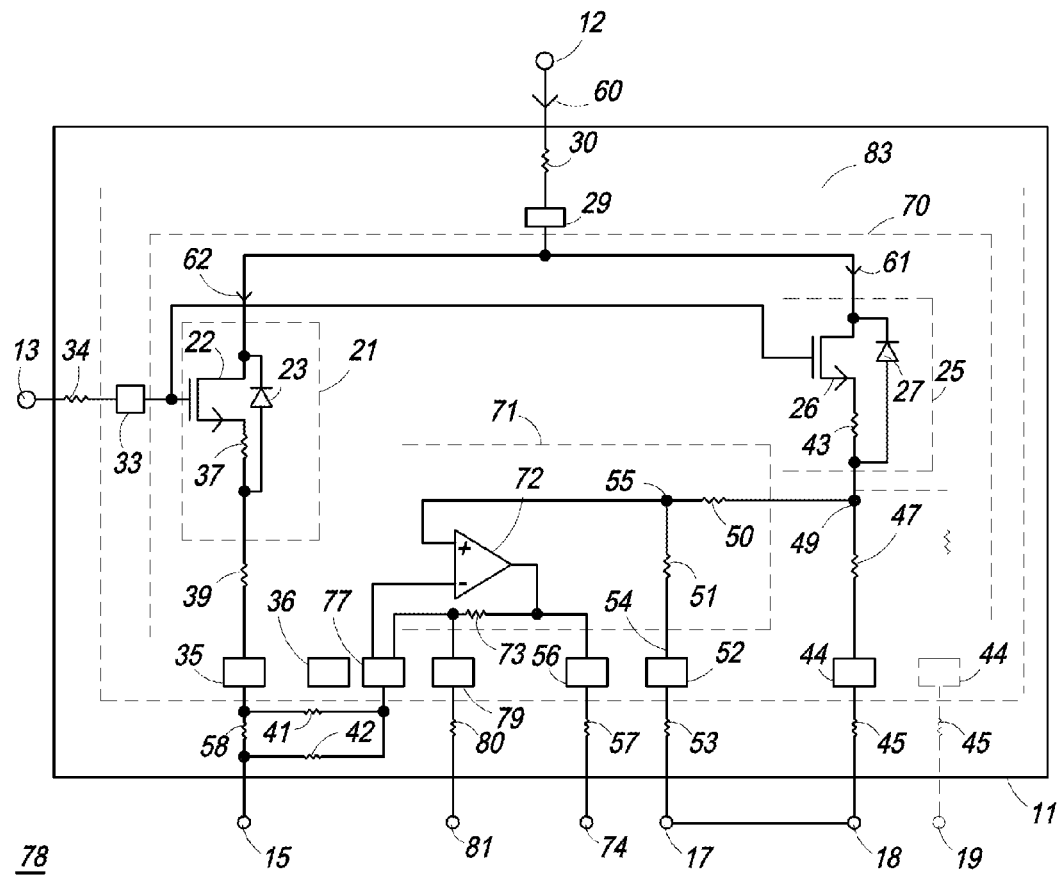
FIG. 4 schematically illustrates an embodiment of a portion of still another improved current sense circuit in accordance with the present invention.

FIG. 4 schematically illustrates an exemplary portion of an embodiment of a current sense circuit 78 that includes a sensing type of transistor or transistor 70. Transistor 70 is similar to transistor 20 except that transistor 70 includes a compensation circuit 71. Circuit 71 is similar to circuit 48 except that an amplifier 72 and a resistor 73 are formed on substrate 83 along with the elements of circuit 48, such as resistors 50 and 51. Amplifier 72 and resistor 73 function similarly to amplifier 65 and resistor 66 of FIG. 2. Additionally, additional connection pads 77 and 79 are added to substrate 83 to facilitate connections to amplifier 72 and resistor 73. Terminal 74 is similar to terminal 16 of circuit 10 but is now used for a different function. An additional terminal 81 is added and connected to pad 79. A resistor 80 illustrates the resistance of the connection between terminal 81 and pad 79. The voltage across resistor 73 forms a current sense signal that is representative of the value of current 60. The current sense signal can be used externally to package 11 from the signals on terminals 74 and 81.

For the embodiment where resistors 41 and 42 are omitted, it is preferable to connect the inverting input of amplifier 72 directly to pad 35 instead of to pad 77. Pad 77 would be connected to pad 35 to form the feedback connection for amplifier 72. Resistors 41 and 42 would be replaced with an open circuit.

Figure 5:
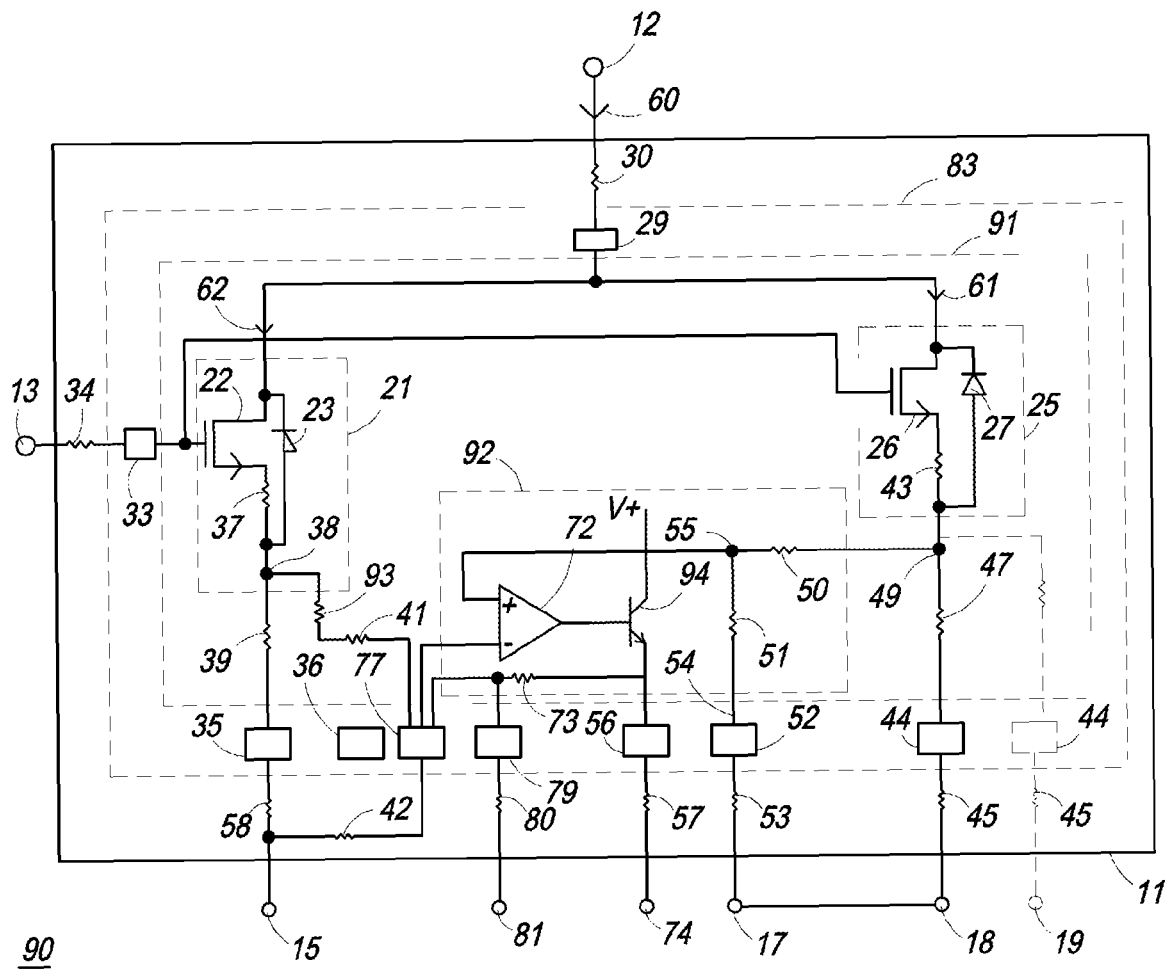
FIG. 5 schematically illustrates an embodiment of a portion of yet another improved current sense circuit in accordance with the present invention.

FIG. 5 schematically illustrates a portion of an exemplary embodiment of a current sense circuit 90 that includes a sensing type of transistor or transistor 91. Transistor 91 is an alternate embodiment of transistor 70 that was explained in the description of FIG. 4. Transistor 91 is similar to transistor 70 except that transistor 91 includes a compensation circuit 92. Circuit 92 is similar to circuit 71 except that the inverting input of amplifier 72 is connected to the source of transistor 21. The connection is typically made by routing an electrical connection on substrate 83. The associated wiring resistance is illustrated by a resistor 93. For the case where the value of resistor 93 is very small, it may be ignored. Additionally, a transistor 94 may be connected between resistor 73 and pad 56 to assist in forming the current sense signal. A voltage usually is connected to the collector of transistor 94. The voltage may be supplied from external to transistor 20 via an additional terminal (not shown) or may be supplied from additional circuitry on substrate 83. Power for operating amplifier 72 may be obtained in a similar manner.

In other embodiments, either or both of resistors 41 and 42 may be omitted. In one embodiment both of resistors 41 and 42 may be omitted. Resistor 41 could be an open and resistor 42 could be a short. For this embodiment, it is preferable to connect pad 77 to pad 35 as illustrated in FIG. 8. In another embodiment, resistor 41 may be replaced by an open while retaining resistor 42 and connecting pad 77 to pad 35 as illustrated by a dashed line in FIG. 8. In another embodiment, resistor 42 may be replaced by a short while retaining resistor 41 and connecting pad 35 to pad 77 as illustrated in FIG. 9. FIG. 10 illustrates another alternate embodiment in which the inverting input of amplifier 72 may be connected to pad 35 instead of pad 77 and pad 77 would be connected to pad 35. Resistor 41 could retained and resistor 42 could be omitted as an open circuit. This embodiment minimizes any concern about the value of resistor 58. FIG. 11 illustrates another optional embodiment where resistor 41 may be replaced by a short and resistor 93 connected to the inverting input of amplifier 72. In this embodiment, resistor 73 is connected to pad 35 instead of pad 77.

Those skilled in the art will appreciate that transistor 94 may also be used in circuit 71 of FIG. 4.

FIG. 6 illustrates an enlarged isometric view of a portion of an embodiment of transistor 70 that is formed on semiconductor substrate 83. In the preferred embodiment, transistor 70 is a vertical power transistor and the backside or bottom of substrate 83 forms the drain for transistor 70. Consequently, a conductor 88 is formed on the backside of substrate 83 to facilitate electrically connecting the drain of transistor 70 to terminal 12. Those skilled in the art will appreciate that transistors 20 or 91 could also be formed similar to transistor 70. Pads 36, 77, and 79 are omitted for clarity of the drawings.

FIG. 7 illustrates a top plan view of a portion of an exemplary embodiment of semiconductor package 11. The illustrated package is generally referred to as an SO-8 flat lead package. However, package 11 may be any other package that has sufficient terminals for either of transistors 20 or 70.

Those skilled in the art will appreciate that as described hereinbefore, the present description includes, among other features, a method of forming a current sense circuit comprising, providing a semiconductor substrate; forming a main transistor on the semiconductor substrate with the main transistor having a source that is formed with a source area; forming a sense transistor on the semiconductor substrate with the sense transistor having a source that is formed with a source area, with a gate of the sense transistor coupled to a gate of the main transistor, and a drain of the sense transistor coupled to a drain of the main transistor wherein the source area of the sense transistor is less than the source area of the main transistor; forming a resistor divider on the semiconductor substrate, the resistor divider having a first resistor and a second resistor with a first terminal of the first resistor coupled to an input of the resistor divider, a second terminal of the first resistor coupled to a sense node, a first terminal of the second resistor coupled to the sense node, and the input of the resistor divider coupled to the source of the main transistor; coupling the input of the resistor divider and the source of the main transistor to a first connection pad on the semiconductor substrate; coupling the source of the sense transistor to a second connection pad on the semiconductor substrate; coupling the sense node to a third connection pad on the semiconductor substrate; coupling a second terminal of the second resistor to a fourth connection pad on the semiconductor substrate; and coupling the first connection pad to a first terminal of a semiconductor package, coupling the second connection pad to a second terminal of the semiconductor package, coupling the third connection pad to a third terminal of the semiconductor package, and coupling the fourth connection pad to a fourth terminal of the semiconductor package.

Additionally, those skilled in the art will understand that, as described hereinbefore, the present description also includes, A sense circuit comprising, among other things, a main transistor and a sense transistor formed on a semiconductor substrate, the main transistor having a source with a source area, a gate, and a drain, the sense transistor having a source with a source area that is less than the source area of the main transistor, a gate coupled to the gate of the main transistor, and a drain coupled to the drain of the main transistor; a resistor divider formed on the semiconductor substrate, the resistor divider having an input, a sense node, a first resistor, and a second resistor, the input of the resistor divider coupled to the source of the main transistor, the first resistor having a first terminal coupled to the input of the resistor divider and a second terminal coupled to the sense node, the second resistor having a first terminal and having a second terminal coupled to the sense node; a first connection pad formed on the semiconductor substrate and coupled to the input of the resistor divider wherein the input of the resistor divider is positioned between the source of the main transistor and the first connection pad; and a semiconductor package attached to the semiconductor substrate, the semiconductor package having a first terminal electrically coupled to the first connection pad.

Another method of forming an accurate sensing circuit that those skilled in the art will realize is described hereinbefore includes, among other things, providing a main transistor having an on-resistance, a gate, and a drain and having a source that is formed with a source area wherein the main transistor is configured to conduct a main transistor current through the source of the main transistor; providing a sense transistor having an on-resistance, a gate coupled to the gate of the main transistor, a drain coupled to the drain of the main transistor and having a source area that is less than the source area of the main transistor wherein the sense transistor is configured to conduct a sense transistor current through the source of the sense transistor and wherein the sense transistor current is ratioed to the main transistor current by a ratio of the on-resistance of the main transistor to the on-resistance of the sense transistor; forming a current flow path for the main transistor current, the current flow path having a wiring resistance; and coupling a compensation circuit to the source of the main transistor wherein the compensation circuit is coupled in parallel with the wiring resistance of the current flow path of the main transistor and configuring the compensation circuit to form a sense signal that is representative of a voltage drop across the wiring resistance and that has a value that is less than the voltage drop across the wiring resistance.

In view of all of the above, it is evident that a novel device and method is disclosed. Included, among other features, is forming a compensation circuit that minimizes variations in the Iratio of a sensing type of transistor. In the preferred embodiment, the compensation circuit is formed on the substrate as a portion of the transistor. This assists in the compensation circuit compensating for parasitic packaging resistances and associated variations thereof. Optional compensation elements may also be used that further assists in minimizing the Iratio variations. The optional elements usually are external to the semiconductor substrate but may be a portion of the substrate in some embodiments.

While the subject matter of the invention is described with specific preferred embodiments, it is evident that alternatives and variations will be apparent to those skilled in the art. As will be appreciated by those skilled in the art, the preferred embodiment of transistor 20 as a vertical MOS transistor formed from a plurality of source cells and having trench type gates is used as a vehicle to explain the compensation method and circuit; however, the transistors used for the main transistor and sense transistor, such as transistors 21 and 25, do not have to be formed from cells but may be stripes or fingers or a single source and do not have to have trench type gates. Additionally the transistors do not have to have a vertical configuration but can be lateral and may also be bipolar instead of MOS transistors. Furthermore, those skilled in the art will appreciate that transistors 21 and 25 and circuit 48 do not have to be formed on a common semiconductor substrate. Transistors 21 and 25 may be on separate substrates and selected to closely match each other, or transistors 21 and 25 may be formed on the same substrate but circuit 48 may not be formed on the same substrate with transistors 21 and 25.

The word "connected" is used throughout for clarity of the description, however, it is intended to have the same meaning as the word "coupled". Accordingly, "connected" should be interpreted as including either a direct connection or an indirect connection.

The invention claimed is:

1. A method of forming a current sense circuit comprising:
   providing a semiconductor substrate;
   forming a main transistor on the semiconductor substrate with the main transistor having a source that is formed with a source area;
   forming a sense transistor on the semiconductor substrate with the sense transistor having a source that is formed with a source area, with a gate of the sense transistor coupled to a gate of the main transistor, and a drain of the sense transistor coupled to a drain of the main transistor wherein the source area of the sense transistor is less than the source area of the main transistor;
   forming a resistor divider on the semiconductor substrate, the resistor divider having a first resistor and a second resistor with a first terminal of the first resistor coupled to an input of the resistor divider, a second terminal of the first resistor coupled to a sense node, a first terminal of the second resistor coupled to the sense node, and the input of the resistor divider coupled to the source of the main transistor;
   coupling the input of the resistor divider and the source of the main transistor to a first connection pad on the semiconductor substrate;
   coupling the source of the sense transistor to a second connection pad on the semiconductor substrate;
   coupling the sense node to a third connection pad on the semiconductor substrate;
   coupling a second terminal of the second resistor to a fourth connection pad on the semiconductor substrate; and
   coupling the first connection pad to a first terminal of a semiconductor package, coupling the second connection pad to a second terminal of the semiconductor package, coupling the third connection pad to a third terminal of the semiconductor package, and coupling the fourth connection pad to a fourth terminal of the semiconductor package.

2. The method of claim 1 wherein coupling the first connection pad to the first terminal of the semiconductor package includes configuring the first terminal to be coupled to a common reference voltage, configuring the second terminal to be coupled to a first input of an amplifier, configuring the third terminal to be coupled to a second input of the amplifier, and configuring the fourth terminal to be coupled to the first terminal.

3. The method of claim 2 further including coupling the gate of the sense transistor and the gate of the main transistor to a fifth connection pad on the semiconductor substrate, coupling the fifth connection pad to a fifth terminal of the semiconductor package, coupling the drain of the sense transistor and the drain of the main transistor to a sixth connection pad on the semiconductor substrate, and coupling the sixth connection pad to a sixth terminal of the semiconductor package.

4. The method of claim 2 further including configuring the second terminal of the semiconductor package to be coupled to a third resistor that is in series between the second terminal of the semiconductor package and the first input of the amplifier.

5. The method of claim 2 further including coupling the source of the sense transistor to a fifth connection pad on the semiconductor substrate, coupling the fifth connection pad to a fifth terminal of the semiconductor package, and configuring the fifth terminal to be coupled to the first input of the amplifier.

6. The method of claim 5 further including configuring the fifth terminal of the semiconductor package to be coupled to a third resistor in series between the fifth terminal of the semiconductor package and the first input of the amplifier.

7. The method of claim 1 further including coupling the source of the sense transistor to a fifth connection pad on the semiconductor substrate, and coupling the fifth connection pad to a fifth terminal of the semiconductor package.

8. The method of claim 7 further including configuring the first terminal to be coupled to a common reference voltage, configuring the fifth terminal to be coupled to a first input of an amplifier, configuring the second terminal to be coupled to an output of the amplifier, configuring the third terminal to be coupled to a second input of the amplifier, and configuring the fourth terminal to be coupled to the first terminal.

9. A sense circuit comprising:
a main transistor and a sense transistor formed on a semiconductor substrate, the main transistor having a source with a source area, a gate, and a drain, the sense transistor having a source with a source area that is less than the source area of the main transistor, a gate coupled to the gate of the main transistor, and a drain coupled to the drain of the main transistor;
a resistor divider formed on the semiconductor substrate, the resistor divider having an input, a sense node, a first resistor, and a second resistor, the input of the resistor divider coupled to the source of the main transistor, the first resistor having a first terminal coupled to the input of the resistor divider and a second terminal coupled to the sense node, the second resistor having a first terminal and having a second terminal coupled to the sense node;
a first connection pad formed on the semiconductor substrate and coupled to the input of the resistor divider wherein the input of the resistor divider is positioned between the source of the main transistor and the first connection pad; and
a semiconductor package attached to the semiconductor substrate, the semiconductor package having a first terminal electrically coupled to the first connection pad.

10. The sense circuit of claim 9 further including a second connection pad formed on the semiconductor substrate and coupled to the source of the sense transistor, a third connection pad formed on the semiconductor substrate and coupled to the sense node, and a fourth connection pad formed on the semiconductor substrate and coupled to the first terminal of the second resistor; and
the semiconductor package having a second terminal electrically coupled to the second connection pad, a third terminal electrically coupled to the third connection pad, and a fourth terminal electrically coupled to the fourth connection pad.

11. The sense circuit of claim 9 further including a second connection pad formed on the semiconductor substrate and coupled to the source of the sense transistor.

12. The sense circuit of claim 9 wherein a distance between the input of the resistor divider and the source of the main transistor is less than a distance between the first connection pad and the source of the main transistor.

13. The sense circuit of claim 9 further including an amplifier formed on the semiconductor substrate, the amplifier having a first input coupled to the sense node, a second input coupled to receive a signal from the source of the sense transistor, and an output.

14. The sense circuit of claim 13 wherein the second input of the amplifier is coupled to the source of the sense transistor.

15. The sense circuit of claim 13 wherein the second input of the amplifier is coupled to a third connection pad and the third connection pad is coupled to the source of the sense transistor.

16. The sense circuit of claim 15 wherein a third resistor is coupled in series between the second input of the amplifier and the source of the sense transistor.

17. A method of forming a sensing circuit comprising:
providing a main transistor having an on-resistance, a gate, and a drain and having a source that is formed with a source area wherein the main transistor is configured to conduct a main transistor current through the source of the main transistor;
providing a sense transistor having an on-resistance, a gate coupled to the gate of the main transistor, a drain coupled to the drain of the main transistor and having a source area that is less than the source area of the main transistor wherein the sense transistor is configured to conduct a sense transistor current through the source of the sense transistor and wherein the sense transistor current is ratioed to the main transistor current by a ratio of the on-resistance of the main transistor to the on-resistance of the sense transistor;
forming a current flow path for the main transistor current, the current flow path having a wiring resistance; and
coupling a compensation circuit to the source of the main transistor wherein the compensation circuit is coupled in parallel with the wiring resistance of the current flow path of the main transistor and configuring the compensation circuit to form a sense signal that is representative of a voltage drop across the wiring resistance and that has a value that is less than the voltage drop across the wiring resistance.

18. The method of claim 17 further including forming the main transistor on a semiconductor substrate and forming the sense transistor and the compensation circuit on the semiconductor substrate.

19. The method of claim 17 wherein coupling the compensation circuit to the source of the main transistor includes coupling a feedback circuit to receive the sense signal and to receive a signal from the source of the sense transistor and cause the sense signal to be substantially equal to a value of the signal from the source of the sense transistor.

20. The method of claim 19 wherein coupling the compensation circuit to the source of the main transistor includes coupling a resistor divider to the source of the main transistor and in parallel with the wiring resistance of the current flow path of the main transistor.

\* \* \* \* \*